(12) United States Patent
Jin

(10) Patent No.: US 12,452,997 B2
(45) Date of Patent: Oct. 21, 2025

(54) PLATFORM SUPPORTING DIRECT ELECTRICAL CONNECTIONS BETWEEN TWO OSFP TRANSCEIVERS

(71) Applicant: Shuang Jin, Dublin, CA (US)

(72) Inventor: Shuang Jin, Dublin, CA (US)

( * ) Notice: Subject to any disclaimer, the term of this patent is extended or adjusted under 35 U.S.C. 154(b) by 400 days.

(21) Appl. No.: 17/844,005

(22) Filed: Jun. 19, 2022

(65) Prior Publication Data
US 2023/0413423 A1    Dec. 21, 2023

(51) Int. Cl.
| | |
|---|---|
| H05K 1/02 | (2006.01) |
| H01R 12/71 | (2011.01) |
| H01R 12/72 | (2011.01) |
| H05K 1/11 | (2006.01) |

(52) U.S. Cl.
CPC ......... *H05K 1/0245* (2013.01); *H01R 12/716* (2013.01); *H01R 12/724* (2013.01); *H05K 1/111* (2013.01); *H05K 1/115* (2013.01); *H05K 2201/10189* (2013.01)

(58) Field of Classification Search
None
See application file for complete search history.

*Primary Examiner* — Timothy J Thompson
*Assistant Examiner* — John B Freal

(57) ABSTRACT

Two OSFP transceivers' connectors' footprints are placed on the opposite sides of a PCB board. The two footprints are aligned in a special way and the connections among the high speed signals' pads of the two footprints are specially defined. Based on that, the high speed signals' pads of the two footprints are connected through PCB traces and vias. Two OSFP electrical connectors are soldered onto the two footprints. So the electrical high-speed signals coming from two OSFP transceivers are directly connected in the shortest way when the two transceivers are respectively plugged into the two OSFP connectors.

17 Claims, 9 Drawing Sheets

PLATFORM SUPPORTING DIRECT ELECTRICAL CONNECTIONS BETWEEN TWO OSFP TRANSCEIVERS

BACKGROUND

Field of the Invention

This application pertains to Telecommunication and Data communication research and development, testing and production.

Background Art

OSFP transceivers are broadly applied in the Telecommunication and Data communication industry for exchange of information over distances. The interconnections in those applications are all about transceivers to host system and host system to transceivers. However, the connections directly between OSFP transceivers had been not discussed and even ignored. Nevertheless, an interposer board supporting direct electrical connections between two transceivers is very potential to establish a fundamental platform, on which new applications will be developed and existing design may be leveraged by using it. This invention will present what the fundamental interposer platform looks like and how it can implements the adjustable length to the shortest and all uniform length electrical connections for all the electrical high-speed signals coming from two OSFP transceivers.

SUMMARY OF THIS INVENTION

In order to achieve the best performance of electrical connections between high-speed signals coming from two OSFP transceivers, the two transceivers need to be plugged into two OSFP electrical connectors mounted on the opposite sides of a PCB interposer board. The two OSFP electrical connectors are soldered or epoxied onto their footprints. Each footprint of the two electrical connectors consists of 60 pads and 32 of them are defined as high-speed signal pads. The two footprints are individually placed on different sides of the PCB interposer board and aligned as the way that all adjacent pads are lined up and spaced evenly by looking through transparent view from either side of the PCB interposer. Length adjustable PCB traces and vias are used to implement the connection of each pair of specially mated pads, which are individually located on the opposite sides of the PCB interposer board. Therefore, the electrical high-speed signals coming from the two transceivers are connected through the electrical connectors, footprints' pads, length adjustable PCB traces and vias.

Overall, this invention is about a PCB interposer platform, which enables the accomplishment of direct, uniform and shortest electrical connections for all the high-speed signals coming from two OSFP transceivers. This utility of the special way of making the connections between two OSFP electrical connectors distinguishes this solution having adjustable length to the shortest capability length possible, being capable to make all connections uniform, taking minimum space and importantly avoiding the use of any RF cables.

DETAILED DESCRIPTION OF THE INVENTION

Figure 1:
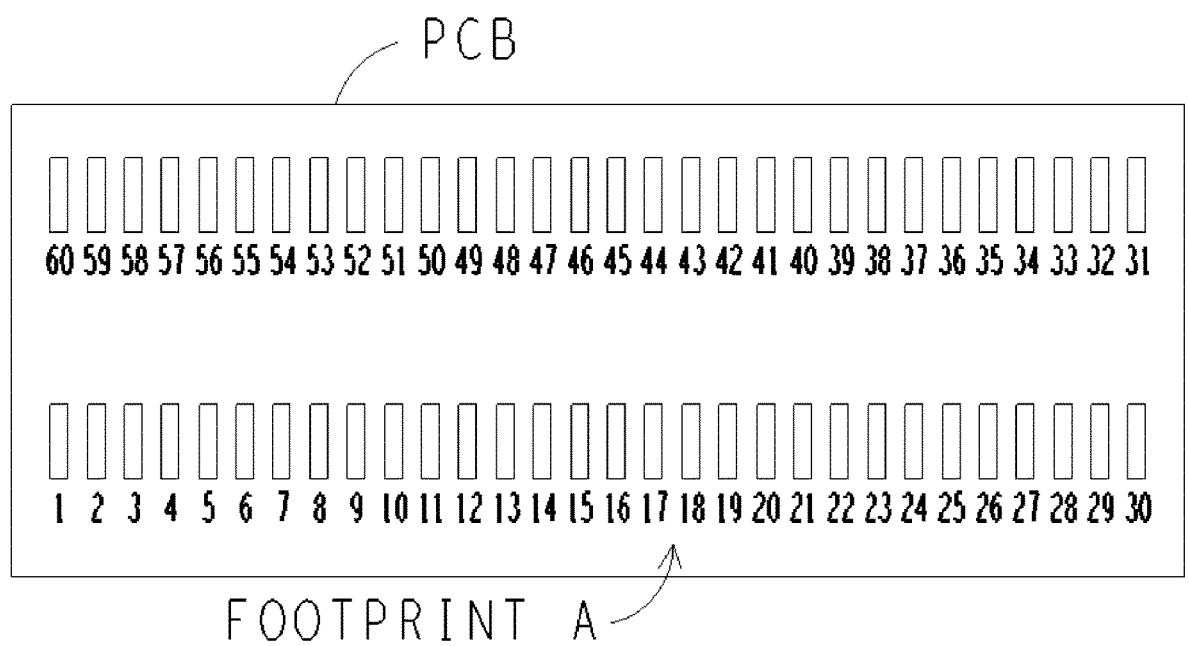
FIG. 1 is a drawing of an OSFP electrical connector's footprint Footprint A on the top side of a PCB (Top view).

An OSFP electrical connector's PCB footprint, designated as Footprint A, is situated on the top side of a PCB board, as depicted in FIG. 1 (Top View). The footprint comprises 60 soldering pads, each designated with a unique number representing its physical location within the footprint.

In the PCB footprint of the OSFP electrical connector, known as Footprint A, certain soldering pads are designated for high-speed signals and GND signals. Table 1 illustrates the pin assignments for these pads. The numbers in Table 1 correspond to the physical locations of the soldering pads within Footprint A, as depicted in FIG. 1.

Figure 2:
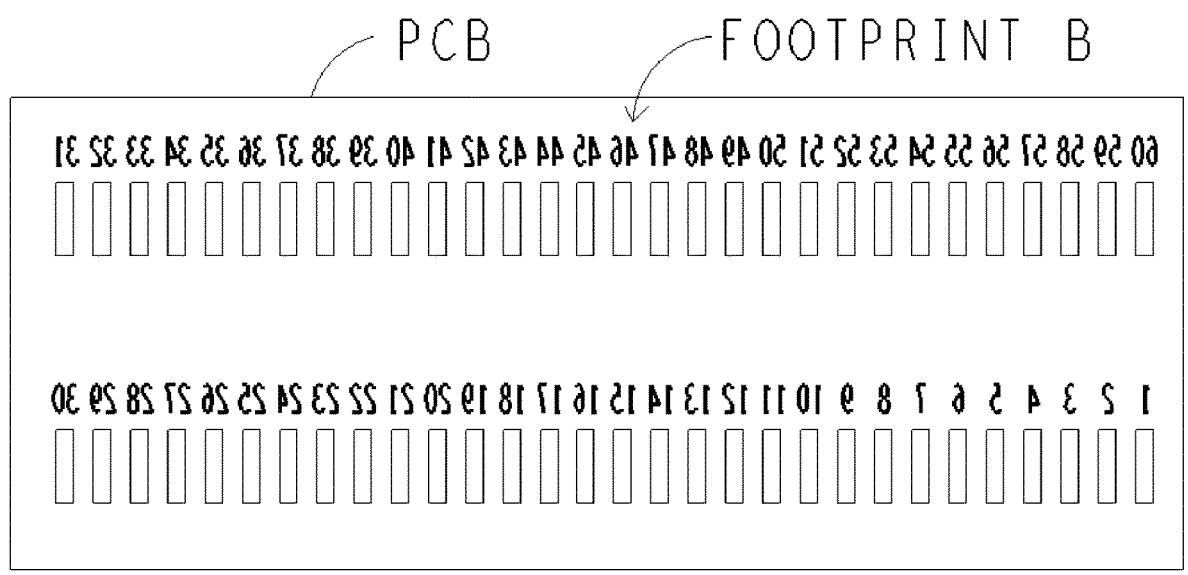
FIG. 2 is a drawing of an OSFP electrical connector's footprint Footprint B on the bottom side of a PCB (Top transparent view).

The PCB footprint of an OSFP electrical connector, labeled as Footprint B, is situated on the bottom side of a PCB board, as depicted in FIG. 2 (Top Transparent View). This footprint consists of 60 soldering pads, each designated with a unique number representing its physical location within the footprint.

In the PCB footprint of the OSFP electrical connector, denoted as Footprint B, certain soldering pads are designated for high-speed signals and GND signals. Table 2 presents the pin assignments for these pads. The numbers in Table 2 correspond to the physical locations of the soldering pads within Footprint B, as illustrated in FIG. 2.

Figure 3:
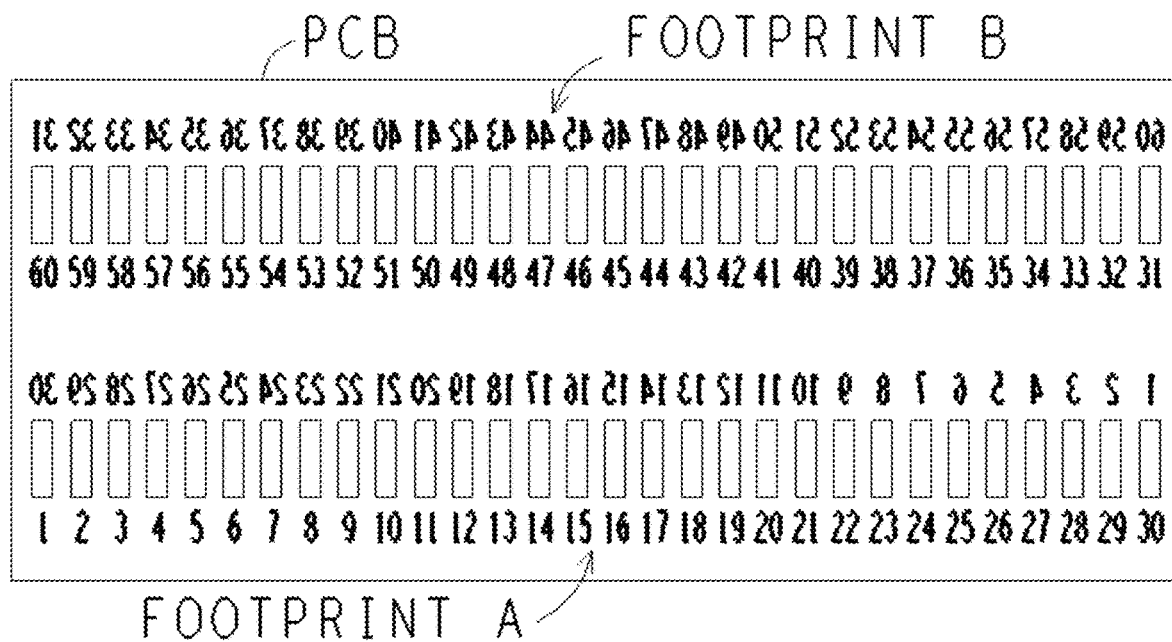
FIG. 3 is a drawing of two OSFP electrical connectors' footprints Footprint A and Footprint B disposed on the different sides of a PCB and aligned in a special way as shown (Top transparent view).

As depicted in FIG. 3, the OSFP electrical connector, Connector A's footprint, denoted as Footprint A, is positioned on the top side of a PCB board, while the OSFP electrical connector, Connector B's footprint, denoted as Footprint B, is positioned on the bottom side of the same PCB board. When viewed perpendicularly through a transparent view from the top side of the PCB board, the two footprints are aligned so that all adjacent pads are lined up and evenly spaced. The pads above the original numbers correspond to Footprint A on the top side of the PCB board, while the pads below the mirrored numbers correspond to Footprint B on the bottom side of the PCB board. The numbers below the pads match the corresponding pad-numbers shown in FIG. 1 and Table 1, whereas the numbers above the pads correspond to the pad-numbers shown in FIG. 2 and Table 2.

As illustrated in FIG. 1 and Table 1, Footprint A comprises both high-speed signals and GND signals. Similarly, FIG. 2 and Table 2 show that Footprint B also contains high-speed signals and GND signals. The connections between the high-speed signals of Footprint A and Footprint B are categorized as Type I, as indicated in Table 3. In Table 3, the numbers in regular font style represent pads from Footprint A, while numbers in bold font style represent pads from the Footprint B. Additionally, numbers in italic font style pads from Footprint A, and numbers in bold and italic font style denote pads from Footprint B.

The connection mappings are as follows:
Footprint A's pad 2 is connected to Footprint B's pad 29,
Footprint A's pad 3 is connected to Footprint B's pad 28,
Footprint A's pad 5 is connected to Footprint B's pad 26,
Footprint A's pad 6 is connected to Footprint B's pad 25,
Footprint A's pad 8 is connected to Footprint B's pad 23,
Footprint A's pad 9 is connected to Footprint B's pad 22,
Footprint A's pad 11 is connected to Footprint B's pad 20,
Footprint A's pad 12 is connected to Footprint B's pad 19;
Footprint A's pad 19 is connected to Footprint B's pad 12,
Footprint A's pad 20 is connected to Footprint B's pad 11,
Footprint A's pad 22 is connected to Footprint B's pad 9,
Footprint A's pad 23 is connected to Footprint B's pad 8,
Footprint A's pad 25 is connected to Footprint B's pad 6,
Footprint A's pad 26 is connected to Footprint B's pad 5,
Footprint A's pad 28 is connected to Footprint B's pad 3,
Footprint A's pad 29 is connected to Footprint B's pad 2;
Footprint A's pad 32 is connected to Footprint B's pad 59,
Footprint A's pad 33 is connected to Footprint B's pad 58,
Footprint A's pad 35 is connected to Footprint B's pad 56,
Footprint A's pad 36 is connected to Footprint B's pad 55,
Footprint A's pad 38 is connected to Footprint B's pad 53,
Footprint A's pad 39 is connected to Footprint B's pad 52,
Footprint A's pad 41 is connected to Footprint B's pad 50,
Footprint A's pad 42 is connected to Footprint B's pad 49;
Footprint A's pad 49 is connected to Footprint B's pad 42,
Footprint A's pad 50 is connected to Footprint B's pad 41,
Footprint A's pad 52 is connected to Footprint B's pad 39,
Footprint A's pad 53 is connected to Footprint B's pad 38,
Footprint A's pad 55 is connected to Footprint B's pad 36,
Footprint A's pad 56 is connected to Footprint B's pad 35,
Footprint A's pad 58 is connected to Footprint B's pad 33,
Footprint A's pad 59 is connected to Footprint B's pad 32.

As depicted in FIG. 1 and Table 1, Footprint A contains high-speed signals and GND signals. Similarly, FIG. 2 and Table 2 illustrate that Footprint B also includes high-speed signals and GND signals. The connections between the high-speed signals of Footprint A and Footprint B are categorized as the Type II, as defined in Table 4. In Table 4, the numbers in regular font style represent pads from Footprint A, while numbers in bold font style represent pads from the Footprint B. Additionally, numbers in the italic font style denote pads from Footprint A, and numbers in bold and italic font style denote pads from Footprint B.

The connection mappings are as follows:
Footprint A's pad 2 is connected to Footprint B's pad 28,
Footprint A's pad 3 is connected to Footprint B's pad 29,
Footprint A's pad 5 is connected to Footprint B's pad 25,
Footprint A's pad 6 is connected to Footprint B's pad 26,
Footprint A's pad 8 is connected to Footprint B's pad 22,
Footprint A's pad 9 is connected to Footprint B's pad 23,
Footprint A's pad 11 is connected to Footprint B's pad 19,
Footprint A's pad 12 is connected to Footprint B's pad 20;
Footprint A's pad 19 is connected to Footprint B's pad 11,
Footprint A's pad 20 is connected to Footprint B's pad 12,
Footprint A's pad 22 is connected to Footprint B's pad 8,
Footprint A's pad 23 is connected to Footprint B's pad 9,
Footprint A's pad 25 is connected to Footprint B's pad 5,
Footprint A's pad 26 is connected to Footprint B's pad 6,
Footprint A's pad 28 is connected to Footprint B's pad 2,
Footprint A's pad 29 is connected to Footprint B's pad 3;
Footprint A's pad 32 is connected to Footprint B's pad 58,
Footprint A's pad 33 is connected to Footprint B's pad 59,
Footprint A's pad 35 is connected to Footprint B's pad 55,
Footprint A's pad 36 is connected to Footprint B's pad 56,
Footprint A's pad 38 is connected to Footprint B's pad 52,
Footprint A's pad 39 is connected to Footprint B's pad 53,
Footprint A's pad 41 is connected to Footprint B's pad 49,
Footprint A's pad 42 is connected to Footprint B's pad 50;
Footprint A's pad 49 is connected to Footprint B's pad 41,
Footprint A's pad 50 is connected to Footprint B's pad 42,
Footprint A's pad 52 is connected to Footprint B's pad 38,
Footprint A's pad 53 is connected to Footprint B's pad 39,
Footprint A's pad 55 is connected to Footprint B's pad 35,
Footprint A's pad 56 is connected to Footprint B's pad 36,
Footprint A's pad 58 is connected to Footprint B's pad 32,
Footprint A's pad 59 is connected to Footprint B's pad 33.

Figure 4:
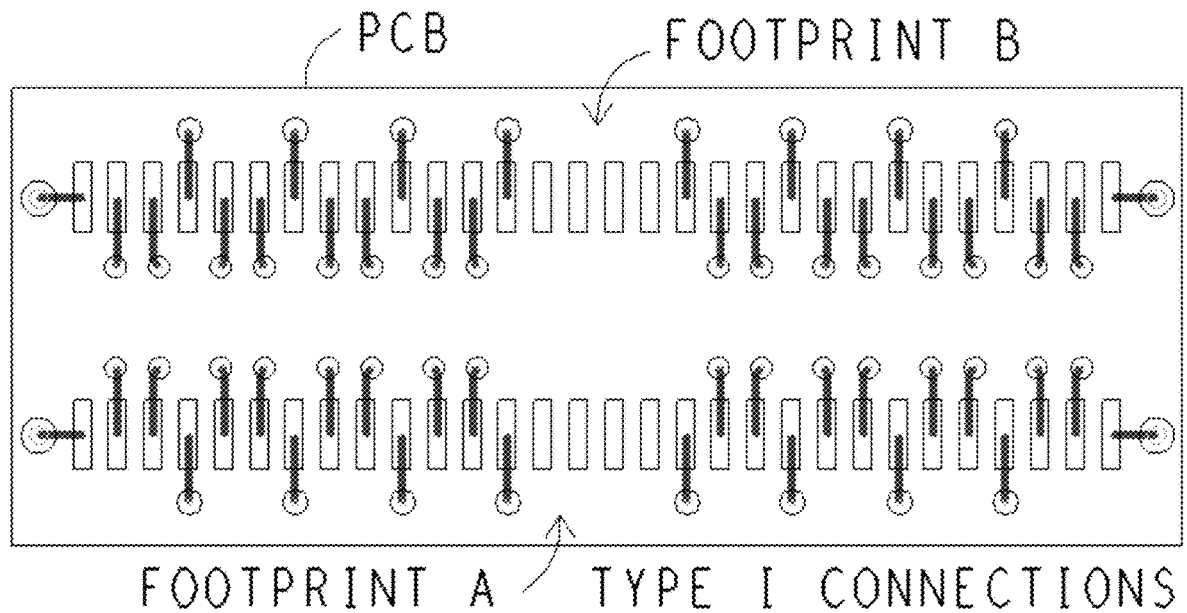
FIG. 4 is a drawing of how the high speed signals' pads of the two OSFP electrical connectors' footprints Footprint A and Footprint B are connected through PCB traces and vias on a PCB board when the connections of the pads are defined in Type I (Top transparent view).

As depicted in FIG. 4, for Type I connections, each pair of mated pads defined in Table 3 are interconnected through length-adjustable PCB traces and at least one through hole via. When viewed from the top transparent view, the pads on the top side of a PCB board and the pads on the bottom side are fully overlapped. Similarly, the length-adjustable PCB traces on both the top and bottom sides are uniformly symmetrical and also fully overlapped in terms of top transparent view. Each through hole via connects to the PCB traces on both the top and bottom sides of the PCB, facilitating the transmission of signals between the corresponding pads on Footprint A and Footprint B.

Figure 5:
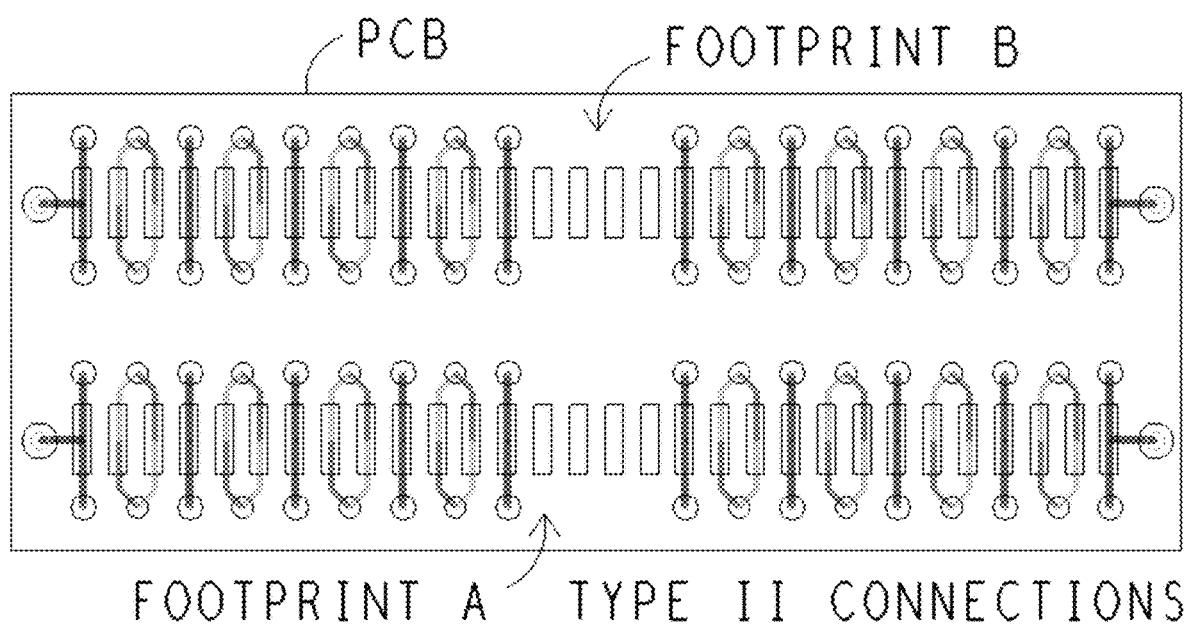
FIG. 5 is a drawing of how the high speed signals' pads of the two OSFP electrical connectors' footprints Footprint A and Footprint B are connected through PCB traces and vias on a PCB board when the connections of the pads are defined in Type II (Top transparent view).

As depicted in FIG. 5, for Type II connections, each pair of mated pads defined in Table 4 are interconnected through length-adjustable PCB traces and at least one through hole via. When viewed from the top transparent view, the pads on the top side of a PCB board and the pads on the bottom side are fully overlapped. Similarly, the length-adjustable PCB traces on both the top and bottom sides are uniformly symmetrical in terms of top transparent view. Each through hole via is connected to the PCB traces on both the top and bottom sides of the PCB, facilitating the transmission of signals between the corresponding pads on Footprint A and Footprint B.

Figure 6:
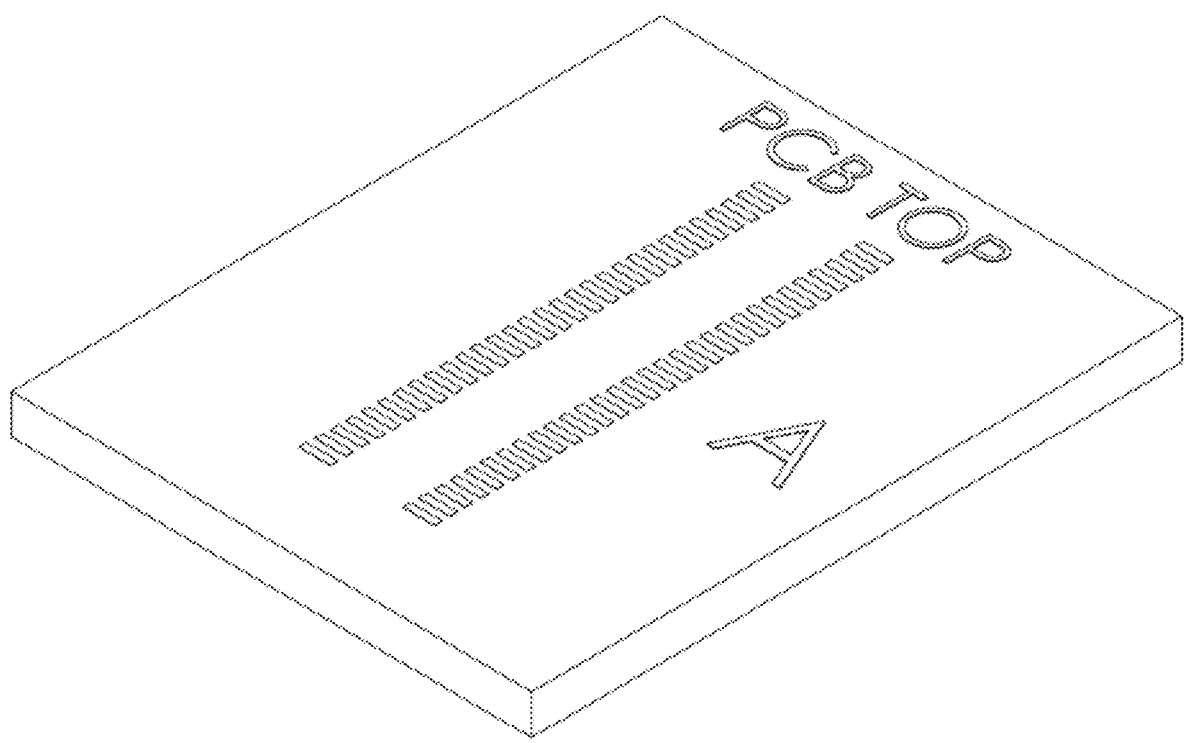
FIG. 6 is a 3D drawing of an OSFP electrical connector's footprint Footprint A disposed on the top side of a PCB board.

The OSFP electrical connector, Connector A's footprint, denoted as Footprint A, is positioned on the top side of a PCB board, as depicted in FIG. 6.

Figure 7:
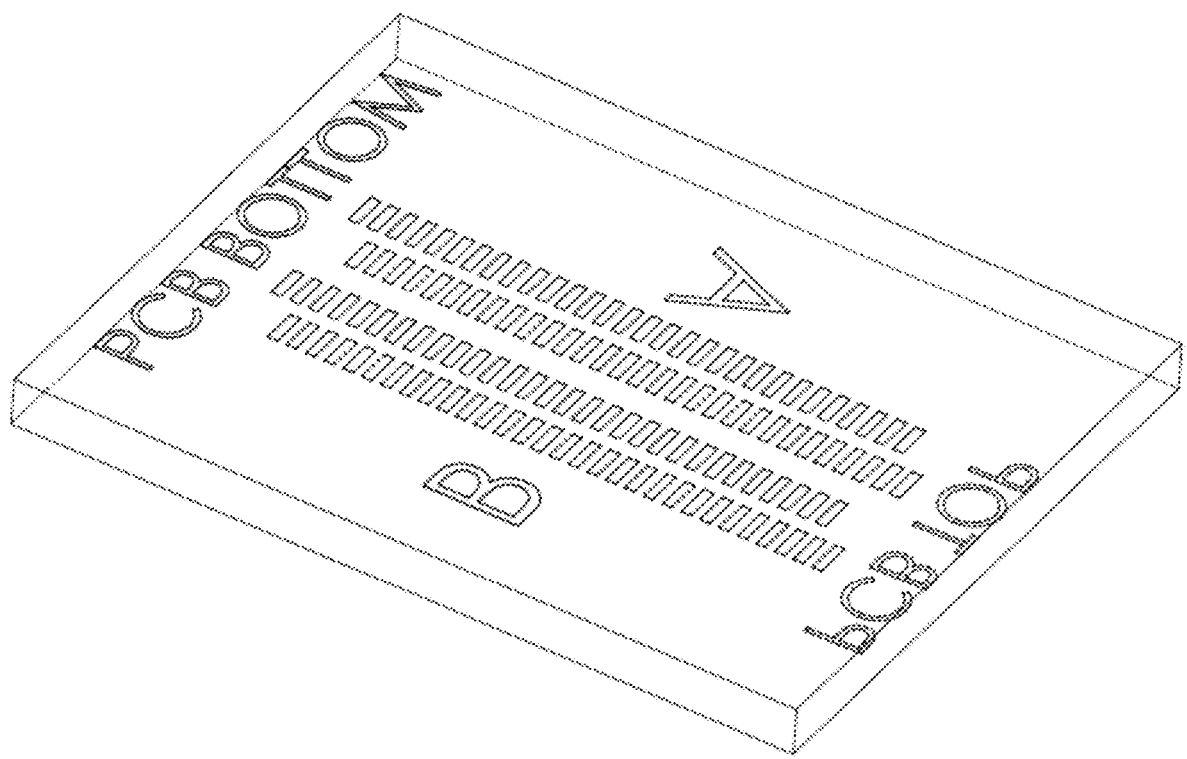
FIG. 7 is a 3D drawing of two OSFP electrical connectors' footprints Footprint A and Footprint B respectively disposed and aligned in a special way on the top side and on the bottom side of a PCB board.

As depicted in FIG. 7, the OSFP electrical connector, Connector B's footprint, denoted as Footprint B, is positioned on the bottom side of the same PCB board shown in FIG. 6. Additionally, the alignment of the two footprints Footprint A and Footprint B, is illustrated in FIG. 3.

Figure 8:
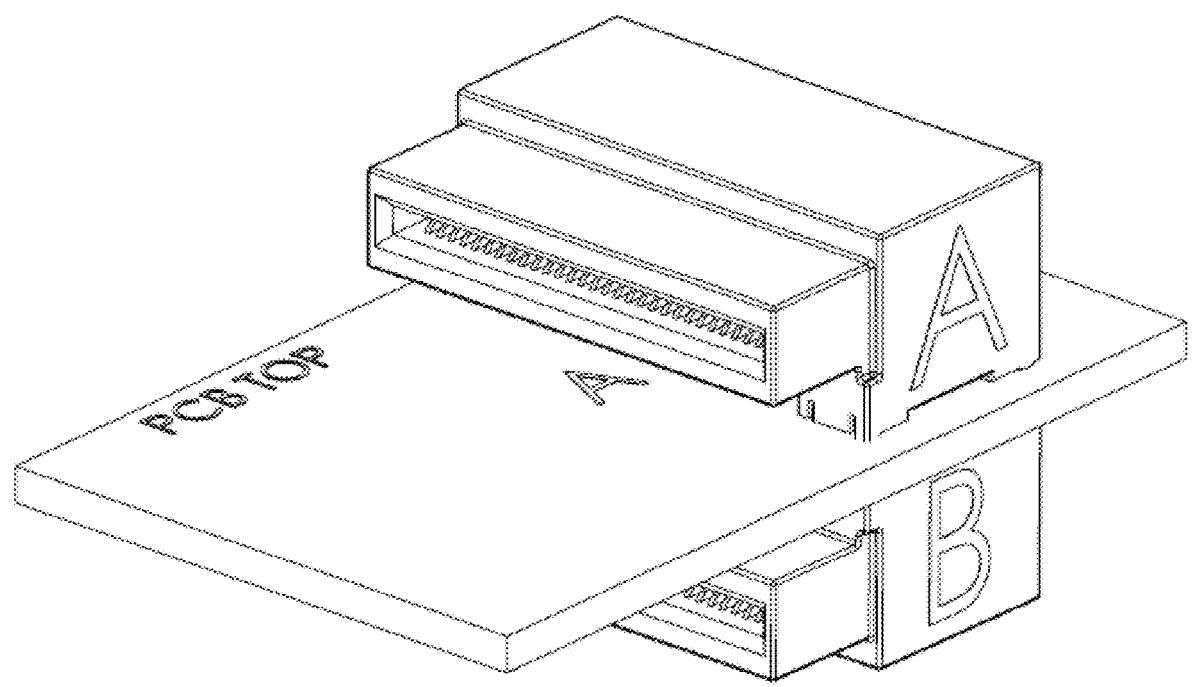
FIG. 8 is a 3D drawing of two OSFP electrical connectors Connector A and Connector B respectively soldered onto their footprints Footprint A and Footprint B, which are located on the top side and the bottom side of a PCB board.

As depicted in FIG. 8, the OSFP electrical connectors, Connector A and Connector B, are individually soldered onto their respective footprints, Footprint A and Footprint B. These footprints are positioned on opposite sides of a PCB board and are specially aligned as shown in FIG. 3.

Figure 9:
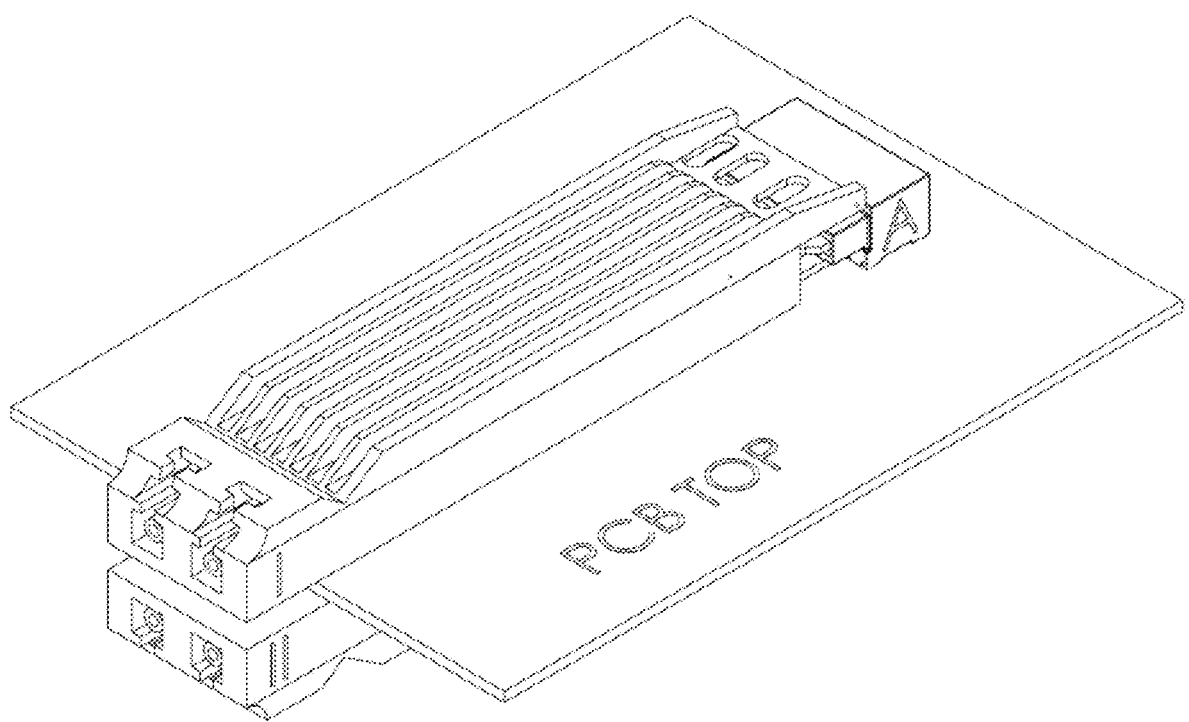
FIG. 9 is a 3D drawing of two OSFP transceivers Transceiver I and Transceiver II respectively plugged into their electrical connectors Connector A and Connector B, which are mounted on the opposite sides of a PCB board.

As depicted in FIG. 9, the OSFP transceivers, Transceiver I and Transceiver II, are respectively inserted into their electrical connectors, Connector A and Connector B. These connectors are individually mounted on Footprint A on the top side of a PCB and Footprint B on the bottom side of the PCB board.

Figure 10:
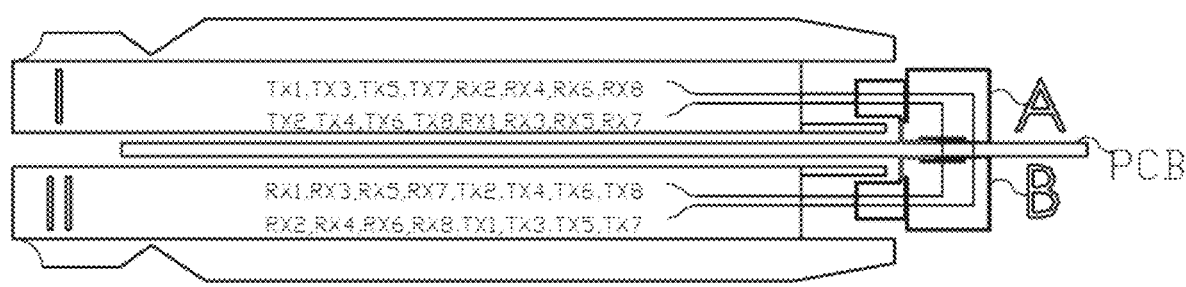
FIG. 10 is a 3D drawing of how high-speed electrical signals coming from two OSFP transceivers Transceiver I and Transceiver II are connected through module edge card connectors, module electrical connectors Connector A and Connector B, connectors' footprints Footprint A and Footprint B, PCB traces and vias.

As depicted in FIG. 10, the high-speed signals from OSFP transceiver Transceiver I (as listed in Table 1) and the high-speed signals from OSFP transceiver Transceiver II (as listed in Table 2) are directly electrically connected. This connection is established through Transceiver I's edge card connector, Connector A, Footprint A, PCB traces, vias, Footprint B, Connector B, and Transceiver II's edge card connector, following the shortest path.

TABLE 1

| Pad 1 | Pad 2 | Pad 3 | Pad 4 | Pad 5 | Pad 6 | Pad 7 | Pad 8 | Pad 9 | Pad 10 | Pad 11 | Pad 12 | Pad 13 |
|---|---|---|---|---|---|---|---|---|---|---|---|---|
| GND | TX2p | TX2n | GND | TX4p | TX4n | GND | TX6p | TX6n | GND | TX8p | TX8n | GND |
| Pad 18 | Pad 19 | Pad 20 | Pad 21 | Pad 22 | Pad 23 | Pad 24 | Pad 25 | Pad 26 | Pad 27 | Pad 28 | Pad 29 | Pad 30 |
| GND | RX7n | RX7p | GND | RX5n | RX5p | GND | RX3n | RX3p | GND | RX1n | RX1p | GND |
| Pad 31 | Pad 32 | Pad 33 | Pad 34 | Pad 35 | Pad 36 | Pad 37 | Pad 38 | Pad 39 | Pad 40 | Pad 41 | Pad 42 | Pad 43 |
| GND | RX2p | RX2n | GND | RX4p | RX4n | GND | RX6p | RX6n | GND | RX8p | RX8n | GND |
| Pad 48 | Pad 49 | Pad 50 | Pad 51 | Pad 52 | Pad 53 | Pad 54 | Pad 55 | Pad 56 | Pad 57 | Pad 58 | Pad 59 | Pad 60 |
| GND | TX7n | TX7p | GND | TX5n | TX5p | GND | TX3n | TX3p | GND | TX1n | TX1p | GND |

TABLE 2

| Pad 30 | Pad 29 | Pad 28 | Pad 27 | Pad 26 | Pad 25 | Pad 24 | Pad 23 | Pad 22 | Pad 21 | Pad 20 | Pad 19 | Pad 18 |
|---|---|---|---|---|---|---|---|---|---|---|---|---|
| GND | RX1p | RX1n | GND | RX3p | RX3n | GND | RX5p | RX5n | GND | RX7p | RX7n | GND |
| Pad 13 | Pad 12 | Pad 11 | Pad 10 | Pad 9 | Pad 8 | Pad 7 | Pad 6 | Pad 5 | Pad 4 | Pad 3 | Pad 2 | Pad 1 |
| GND | TX8n | TX8p | GND | TX6n | TX6p | GND | TX4n | TX4p | GND | TX2n | TX2p | GND |
| Pad 60 | Pad 59 | Pad 58 | Pad 57 | Pad 56 | Pad 55 | Pad 54 | Pad 53 | Pad 52 | Pad 51 | Pad 50 | Pad 49 | Pad 48 |
| GND | TX1p | TX1n | GND | TX3p | TX3n | GND | TX5p | TX5n | GND | TX7p | TX7n | GND |
| Pad 43 | Pad 42 | Pad 41 | Pad 40 | Pad 39 | Pad 38 | Pad 37 | Pad 36 | Pad 35 | Pad 34 | Pad 33 | Pad 32 | Pad 31 |
| GND | RX8n | RX8p | GND | RX6n | RX6p | GND | RX4n | RX4p | GND | RX2n | RX2p | GND |

TABLE 3

| Pad 1 | Pad 2 | Pad 3 | Pad 4 | Pad 5 | Pad 6 | Pad 7 | Pad 8 | Pad 9 | Pad 10 | Pad 11 | Pad 12 | Pad 13 |
|---|---|---|---|---|---|---|---|---|---|---|---|---|
| GND | TX2p | TX2n | GND | TX4p | TX4n | GND | TX6p | TX6n | GND | TX8p | TX8n | GND |
| Pad 30 | Pad 29 | Pad 28 | Pad 27 | Pad 26 | Pad 25 | Pad 24 | Pad 23 | Pad 22 | Pad 21 | Pad 20 | Pad 19 | Pad 18 |
| GND | RX1p | RX1n | GND | RX3p | RX3n | GND | RX5p | RX5n | GND | RX7p | RX7n | GND |
| Pad 18 | Pad 19 | Pad 20 | Pad 21 | Pad 22 | Pad 23 | Pad 24 | Pad 25 | Pad 26 | Pad 27 | Pad 28 | Pad 29 | Pad 30 |
| GND | RX7n | RX7p | GND | RX5n | RX5p | GND | RX3n | RX3p | GND | RX1n | RX1p | GND |
| Pad 13 | Pad 12 | Pad 11 | Pad 10 | Pad 9 | Pad 8 | Pad 7 | Pad 6 | Pad 5 | Pad 4 | Pad 3 | Pad 2 | Pad 1 |
| GND | TX8n | TX8p | GND | TX6n | TX6p | GND | TX4n | TX4p | GND | TX2n | TX2p | GND |
| Pad 31 | Pad 32 | Pad 33 | Pad 34 | Pad 35 | Pad 36 | Pad 37 | Pad 38 | Pad 39 | Pad 40 | Pad 41 | Pad 42 | Pad 43 |
| GND | RX2p | RX2n | GND | RX4p | RX4n | GND | RX6p | RX6n | GND | RX8p | RX8n | GND |
| Pad 60 | Pad 59 | Pad 58 | Pad 57 | Pad 56 | Pad 55 | Pad 54 | Pad 53 | Pad 52 | Pad 51 | Pad 50 | Pad 49 | Pad 48 |
| GND | TX1p | TX1n | GND | TX3p | TX3n | GND | TX5p | TX5n | GND | TX7p | TX7n | GND |

TABLE 3-continued

| Pad 48 | Pad 49 | Pad 50 | Pad 51 | Pad 52 | Pad 53 | Pad 54 | Pad 55 | Pad 56 | Pad 57 | Pad 58 | Pad 59 | Pad 60 |
|---|---|---|---|---|---|---|---|---|---|---|---|---|
| GND | TX7n | TX7p | GND | TX5n | TX5p | GND | TX3n | TX3p | GND | TX1n | TX1p | GND |
| Pad 43 | Pad 42 | Pad 41 | Pad 40 | Pad 39 | Pad 38 | Pad 37 | Pad 36 | Pad 35 | Pad 34 | Pad 33 | Pad 32 | Pad 31 |
| GND | RX8n | RX8p | GND | RX6n | RX6p | GND | RX4n | RX4p | GND | RX2n | RX2p | GND |

TABLE 4

| Pad 1 | Pad 2 | Pad 3 | Pad 4 | Pad 5 | Pad 6 | Pad 7 | Pad 8 | Pad 9 | Pad 10 | Pad 11. | Pad 12 | Pad 13 |
|---|---|---|---|---|---|---|---|---|---|---|---|---|
| GND | TX2p | TX2n | GND | TX4p | TX4n | GND | TX6p | TX6n | GND | TX8p | TX8n | GND |
| Pad 30 | Pad 28 | Pad 29 | Pad 27 | Pad 25 | Pad 26 | Pad 24 | Pad 22 | Pad 23 | Pad 21 | Pad 19 | Pad 20 | Pad 18 |
| GND | RX1n | RX1p | GND | RX3n | RX3p | GND | RX5n | RX5p | GND | RX7n | RX7p | GND |
| Pad 18 | Pad 19 | Pad 20 | Pad 21 | Pad 22 | Pad 23 | Pad 24 | Pad 25 | Pad 26 | Pad 27 | Pad 28 | Pad 29 | Pad 30 |
| GND | RX7n | RX7p | GND | RX5n | RX5p | GND | RX3n | RX3p | GND | RX1n | RX1p | GND |
| Pad 13 | Pad 11 | Pad 12 | Pad 10 | Pad 8 | Pad 9 | Pad 7 | Pad 5 | Pad 6 | Pad 4 | Pad 2 | Pad 3 | Pad 1 |
| GND | TX8p | TX8n | GND | TX6p | TX6n | GND | TX4p | TX4n | GND | TX2p | TX2n | GND |
| Pad 31 | Pad 32 | Pad 33 | Pad 34 | Pad 35 | Pad 36 | Pad 37 | Pad 38 | Pad 39 | Pad 40 | Pad 41 | Pad 42 | Pad 43 |
| GND | RX2p | RX2n | GND | RX4p | RX4n | GND | RX6p | RX6n | GND | RX8p | RX8n | GND |
| Pad 60 | Pad 58 | Pad 59 | Pad 57 | Pad 55 | Pad 56 | Pad 54 | Pad 52 | Pad 53 | Pad 51 | Pad 49 | Pad 50 | Pad 48 |
| GND | TX1n | TX1p | GND | TX3n | TX3p | GND | TX5n | TX5p | GND | TX7n | TX7p | GND |
| Pad 48 | Pad 49 | Pad 50 | Pad 51 | Pad 52 | Pad 53 | Pad 54 | Pad 55 | Pad 56 | Pad 57| | Pad 58 | Pad 59 | Pad 60 |
| GND | TX7n | TX7p | GND | TX5n | TX5p | GND | TX3n | TX3p | GND | TX1n | TX1p | GND |
| Pad 43 | Pad 41 | Pad 42 | Pad 40 | Pad 38 | Pad 39 | Pad 37 | Pad 35 | Pad 36 | Pad 34 | Pad 32 | Pad 33 | Pad 31 |
| GND | RX8p | RX8n | GND | RX6p | RX6n | GND | RX4p | RX4n | GND | RX2p | RX2n | GND |

The invention claimed is:

1. An interposer comprising:
A first OSFP electrical connector, Connector A, and its footprint, Footprint A, disposed on a top surface of a substrate,
A second OSFP electrical connector, Connector B, and its footprint, Footprint B disposed on a bottom surface of the substrate,
Wherein Footprint A has 8 pairs of differential transmitting signal pads and 8 pairs of differential receiving signal pads,
Footprint B has 8 pairs of differential transmitting signal pads and 8 pairs of differential receiving signal pads,
The 8 pairs of differential transmitting signal pads of Footprint A are connected to the corresponding 8 pairs of differential receiving signal pads of Footprint B,
The 8 pairs of differential transmitting signal pads of Footprint B are connected to the corresponding 8 pairs of differential receiving signal pads of Footprint A,
Wherein each of these 32 pad to pad connections is implemented through length adjustable metal traces plus at least one metal plated through hole via and forms 16 pairs of pad to pad connections,
Wherein the length adjustable metal traces for each of these 32 pad to pad connections are further specified such that the total length of all segments is in a range of 0 mm to 200 mm, including 0 mm,
Additionally, the length adjustable metal traces among the 16 pairs of 32 pad to pad connections from transmitting pads to receiving pads could be uniformly symmetrical or in different forms.

2. The OSFP electrical connector, Connector A, in claim 1 is compliant with OSFP electrical connector "Single Row SMT Connector" in "OSFP Module Specification Rev 4.1".

3. The OSFP electrical connector, Connector B, in claim 1 is compliant with OSFP electrical connector "Single Row SMT Connector" in "OSFP Module Specification Rev 4.1".

4. The footprint of OSFP electrical connector, Connector A, in claim 1 matches Host PCB layout pattern in "OSFP Module Specification Rev 4.1" and is compliant with the Host PCB layout pattern in "OSFP Module Specification Rev 4.1".

5. The footprint of OSFP electrical connector, Connector B, in claim 1 matches Host PCB layout pattern in "OSFP Module Specification Rev 4.1" and is compliant with the Host PCB layout pattern in "OSFP Module Specification Rev 4.1".

6. The Footprint A's pads in claim 1 match the Host PCB layout pattern pads in "OSFP Module Specification Rev 4.1" and are compliant with the Host PCB layout pattern pads in "OSFP Module Specification Rev 4.1".

7. The Footprint B's pads in claim 1 match the Host PCB layout pattern pads in "OSFP Module Specification Rev 4.1"

and are compliant with the Host PCB layout pattern pads in "OSFP Module Specification Rev 4.1".

8. The 32 pad to pad connections in claim 1 are defined as Type I as the followings:

Footprint A's pad 2 is connected to Footprint B's pad 29,
Footprint A's pad 3 is connected to Footprint B's pad 28,
Footprint A's pad 5 is connected to Footprint B's pad 26,
Footprint A's pad 6 is connected to Footprint B's pad 25,
Footprint A's pad 8 is connected to Footprint B's pad 23,
Footprint A's pad 9 is connected to Footprint B's pad 22,
Footprint A's pad 11 is connected to Footprint B's pad 20,
Footprint A's pad 12 is connected to Footprint B's pad 19,
Footprint A's pad 19 is connected to Footprint B's pad 12,
Footprint A's pad 20 is connected to Footprint B's pad 11,
Footprint A's pad 22 is connected to Footprint B's pad 9,
Footprint A's pad 23 is connected to Footprint B's pad 8,
Footprint A's pad 25 is connected to Footprint B's pad 6,
Footprint A's pad 26 is connected to Footprint B's pad 5,
Footprint A's pad 28 is connected to Footprint B's pad 3,
Footprint A's pad 29 is connected to Footprint B's pad 2,
Footprint A's pad 32 is connected to Footprint B's pad 59,
Footprint A's pad 33 is connected to Footprint B's pad 58,
Footprint A's pad 35 is connected to Footprint B's pad 56,
Footprint A's pad 36 is connected to Footprint B's pad 55,
Footprint A's pad 38 is connected to Footprint B's pad 53,
Footprint A's pad 39 is connected to Footprint B's pad 52,
Footprint A's pad 41 is connected to Footprint B's pad 50,
Footprint A's pad 42 is connected to Footprint B's pad 49,
Footprint A's pad 49 is connected to Footprint B's pad 42,
Footprint A's pad 50 is connected to Footprint B's pad 41,
Footprint A's pad 52 is connected to Footprint B's pad 39,
Footprint A's pad 53 is connected to Footprint B's pad 38,
Footprint A's pad 55 is connected to Footprint B's pad 36,
Footprint A's pad 56 is connected to Footprint B's pad 35,
Footprint A's pad 58 is connected to Footprint B's pad 33,
Footprint A's pad 59 is connected to Footprint B's pad 32.

9. The 32 pad to pad connections in claim 1 also could be defined as Type II as the followings:

Footprint A's pad 2 is connected to Footprint B's pad 28,
Footprint A's pad 3 is connected to Footprint B's pad 29,
Footprint A's pad 5 is connected to Footprint B's pad 25,
Footprint A's pad 6 is connected to Footprint B's pad 26,
Footprint A's pad 8 is connected to Footprint B's pad 22,
Footprint A's pad 9 is connected to Footprint B's pad 23,
Footprint A's pad 11 is connected to Footprint B's pad 19,
Footprint A's pad 12 is connected to Footprint B's pad 20,
Footprint A's pad 19 is connected to Footprint B's pad 11,
Footprint A's pad 20 is connected to Footprint B's pad 12,
Footprint A's pad 22 is connected to Footprint B's pad 8,
Footprint A's pad 23 is connected to Footprint B's pad 9,
Footprint A's pad 25 is connected to Footprint B's pad 5,
Footprint A's pad 26 is connected to Footprint B's pad 6,
Footprint A's pad 28 is connected to Footprint B's pad 2,
Footprint A's pad 29 is connected to Footprint B's pad 3,
Footprint A's pad 32 is connected to Footprint B's pad 58,
Footprint A's pad 33 is connected to Footprint B's pad 59,
Footprint A's pad 35 is connected to Footprint B's pad 55,
Footprint A's pad 36 is connected to Footprint B's pad 56,
Footprint A's pad 38 is connected to Footprint B's pad 52,
Footprint A's pad 39 is connected to Footprint B's pad 53,
Footprint A's pad 41 is connected to Footprint B's pad 49,
Footprint A's pad 42 is connected to Footprint B's pad 50,
Footprint A's pad 49 is connected to Footprint B's pad 41,
Footprint A's pad 50 is connected to Footprint B's pad 42,
Footprint A's pad 52 is connected to Footprint B's pad 38,
Footprint A's pad 53 is connected to Footprint B's pad 39,
Footprint A's pad 55 is connected to Footprint B's pad 35,
Footprint A's pad 56 is connected to Footprint B's pad 36,
Footprint A's pad 58 is connected to Footprint B's pad 32,
Footprint A's pad 59 is connected to Footprint B's pad 33.

10. The interposer of claim 8, wherein the pads may have a length of 0.01 mm to 2.4 mm and a base width of 0.01 mm to 0.6 mm, and the pairs of differential signal pads of Footprint A are offset by 0.01 mm to 4 mm from the differential receiving signal pads of Footprint A and the pairs of differential signal pads of Footprint B are offset by 0.01 mm to 4 mm from the differential receiving signal pads of Footprint B.

11. The interposer of claim 9, wherein the pads may have a length of 0.01 mm to 2.4 mm and a base width of 0.01 mm to 0.6 mm, and the pairs of differential signal pads of Footprint A are offset by 0.01 mm to 4 mm from the differential receiving signal pads of Footprint A and the pairs of differential signal pads of Footprint B are offset by 0.01 mm to 4 mm from the differential receiving signal pads of Footprint B.

12. A platform comprising: the interposer in claim 1,

Wherein the OSFP electrical connector, Connector A, in claim 1 is soldered, or epoxied, onto the Footprint A in claim 1 and the OSFP electrical connector, Connector B, in claim 1 is soldered, or epoxied, onto the Footprint B in claim 1, A first OSFP transceiver module, Transceiver I, is plugged in the Connector A in claim 1 and a second OSFP transceiver module, Transceiver II, is plugged in the Connector B in claim 1.

13. The platform in claim 12 provides a method of direct, not through any ICs, cableless, without using any RF-cables, and uniform capable electrical high-speed connections for the electrical high-speed signals between the first OSFP transceiver module, Transceiver I, in claim 12 and the second OSFP transceiver module, Transceiver II, in claim 12.

14. Either the first OSFP transceiver module, Transceiver I, in claim 12 or the second OSFP transceiver module, Transceiver II, in claim 12 does not have to be in compliance with "OSFP Module Specification Rev 4.1", and can be a Form Factor Pluggable SQA (Signal Quality Analyzer), a Form Factor Pluggable DCA (Data Communication Analyzer) or Form Factor Pluggable FEC (Forward Error Correction) Network Traffic Tester.

15. Each of these 32 pad to pad connections in claim 1 is implemented through length adjustable metal traces plus at least two metal plated stacked vias.

16. Each of these 32 pad to pad connections in claim 1 is implemented through length adjustable metal traces plus at least two metal plated staggered vias.

17. An interposer comprising:

A first OSFP electrical connector, Connector A, and its footprint, Footprint A, disposed on a top surface of a substrate, A second OSFP electrical connector, connector B, and its footprint, Footprint B, disposed on a bottom surface of the substrate, Wherein Footprint A has between 2 and 128 pairs of differential transmitting signal pads and between 2 and 128 pairs of differential receiving signal pads, Wherein Footprint B has between 2 and 128 pairs of differential transmitting signal pads and between 2 and 128 pairs of differential receiving signal pads, The between 2 and 128 pairs of differential transmitting signal pads of Footprint A are connected to the corresponding between 2 and 128 pairs of differential receiving signal pads of Footprint B, The between 2 and 128 pairs of differential transmitting signal pads of Footprint B are connected to the corresponding between 2 and 128 pairs of differential receiving signal pads of Footprint A, Wherein each of these pad to pad connections is implemented through length adjustable metal traces plus at least one metal plated through hole via and forms a corresponding number of pairs of pad to pad connections, Wherein the length adjustable metal traces for each of these pad to pad connections are further specified such that the total length of all segments is in a range of 0 mm to 200 mm, including 0 mm, The length adjustable metal traces among the pairs of pad to pad connections from transmitting pads to receiving pads could be uniformly symmetrical or in different forms.

* * * * *